United States Patent
Chin et al.

(10) Patent No.: US 7,005,219 B2
(45) Date of Patent: Feb. 28, 2006

(54) DEFECT REPAIR METHOD EMPLOYING NON-DEFECTIVE PATTERN OVERLAY AND PHOTOEXPOSURE

(75) Inventors: Chih-Cheng Chin, Taipei (TW); Shih-Ming Chang, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 228 days.

(21) Appl. No.: 10/431,859

(22) Filed: May 8, 2003

(65) Prior Publication Data

US 2004/0224238 A1    Nov. 11, 2004

(51) Int. Cl.
   G03F 1/08    (2006.01)
   G03F 9/00    (2006.01)
   G03F 7/16    (2006.01)
   G03F 7/40    (2006.01)
   H01L 21/027  (2006.01)

(52) U.S. Cl. .................. 430/5; 430/22; 430/311; 430/313; 438/4

(58) Field of Classification Search .................. 430/5, 430/22, 298, 322–324, 311, 313, 315, 318; 438/4, 674, 669–670, 676, 706, 745; 427/584, 427/595, 597

See application file for complete search history.

(56) References Cited

U.S. PATENT DOCUMENTS 3,748,975 A * 7/1973 Tarabocchia ................ 396/548
6,319,637 B1 * 11/2001 Higashikawa et al. ......... 430/5

* cited by examiner

*Primary Examiner*—Mark F. Huff
*Assistant Examiner*—John Ruggles
(74) *Attorney, Agent, or Firm*—Tung & Associates

(57) ABSTRACT

A method for repairing a defective photomask having contained therein a minimum of one defect within a defective pattern employs a non-defective photomask for purposes of photoexposing a photoresist layer formed upon the defective photomask such as to form a patterned photoresist layer which leaves exposed the minimum of one defect. The minimum of one defect may then be repaired with the patterned photoresist layer in place as a repair mask. The method also provides for use of a non-defective pattern region within a defective photomask in a like fashion for repairing a defective pattern region within the same photomask. The method may be extended to repairing defective microelectronic products.

20 Claims, 5 Drawing Sheets

DEFECT REPAIR METHOD EMPLOYING NON-DEFECTIVE PATTERN OVERLAY AND PHOTOEXPOSURE

BACKGROUND OF THE INVENTION

1. Field of the Invention

The present invention relates generally to methods for repairing patterned layers formed over substrates employed for fabricating microelectronic products. More particularly, the present invention relates to methods for efficiently repairing photomasks employed for fabricating microelectronic products.

2. Description of the Related Art

Common in the microelectronic product fabrication art is the use of photomasks for purposes of defining patterned photoresist layers which in turn are employed for defining patterned microelectronic layers and patterned microelectronic structures when fabricating microelectronic products.

While photomasks are clearly desirable and often essential in the microelectronic product fabrication art, photomasks are nonetheless not entirely without problems in the microelectronic product fabrication art. In that regard, photomasks often suffer from defects which are difficult to efficiently repair since photomask repair methods often employ direct repair methods and apparatus which require lengthy processing time and often result in incidental damage when repairing photomasks.

It is thus desirable to provide methods for efficiently repairing photomasks employed for fabricating microelectronic products. It is towards the foregoing object that the present invention is directed.

Various methods for repairing photomasks have been disclosed in the microelectronic product fabrication art.

Included but not limiting among the methods are methods disclosed within: (1) Adair et al., in U.S. Pat. No. 5,506,080 (a photomask repair method which involves repair of defects within a photoresist layer employed for fabricating a photomask); (2) Shimanaka, in U.S. Pat. No. 5,757,480 (a laser alignment method for photomask repair); (3) George et al., in U.S. Pat. No. 5,981,110 (a photoresist masking layer method for photomask repair); and (4) Grenon et al., in U.S. Pat. No. 6,165,649 (a sacrificial masking layer method for photomask repair).

The teachings of each of the foregoing references are incorporated herein fully by reference.

Desirable are additional methods for efficiently repairing photomasks employed for fabricating microelectronic products.

It is towards the foregoing object that the present invention is directed.

SUMMARY OF THE INVENTION

A first object of the invention is to provide a method for repairing a photomask.

A second object of the invention is to provide a method in accord with the first object of the invention, wherein the photomask is efficiently repaired.

In accord with the objects of the invention, the invention provides a method for repairing a photomask.

To practice the method of the invention, there is first provided a defective photomask having contained therein a defective pattern having a minimum of one defect. There is also provided a non-defective photomask having contained therein a non-defective pattern identical to the defective pattern, but absent the minimum of one defect. There is also formed a photoresist layer upon the defective photomask including the defective pattern to form a photoresist coated defective photomask. There is then aligned, via optical projection, the non-defective pattern within the non-defective photomask with the defective pattern within the photoresist coated defective photomask. There is then photoexposed and developed the photoresist layer upon the photoresist coated defective photomask while employing the non-defective pattern within the non-defective photomask as a mask to form a patterned photoresist layer coated defective photomask which leaves exposed the minimum of one defect within the defective pattern. Finally, there is then repaired the minimum of one defect within the defective pattern while employing the patterned photoresist layer as a repair mask.

The method may also be extended to repairing a defective patterned layer within a microelectronic product.

The present invention provides a method for repairing a photomask, wherein the photomask is efficiently repaired.

The present invention realizes the foregoing object by employing an identical non-defective pattern within a non-defective photomask as a photomask for forming upon a defective pattern within a defective photomask a patterned photoresist layer which serves as a mask layer for repairing a defect within the defective pattern within the defective photomask.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for repairing a photomask, wherein the photomask is efficiently repaired.

The present invention realizes the foregoing object by employing an identical non-defective pattern within a non-defective photomask as a photomask for forming upon a defective pattern within a defective photomask a patterned photoresist layer which serves as a mask layer for repairing a defect within the defective pattern within the defective photomask.

FIG. 1 to FIG. 6 show a series of schematic cross-sectional diagrams and schematic plan-view diagrams illustrating: (1) a non-defective photomask which may be employed within the context of the present invention; and (2) a pair of defective photomasks which may be repaired in accord with the present invention. The photomasks may be employed for fabricating microelectronic products, and in particular semiconductor products.

Figure 1:
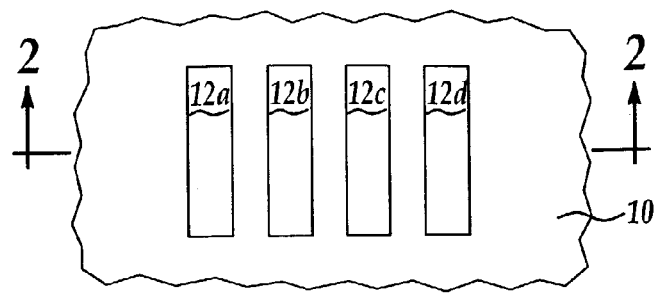
FIG. 1 and FIG. 2 show a schematic cross-sectional diagram and a schematic plan-view diagram of a non-defective photomask which may be employed within the invention.
Figure 2:
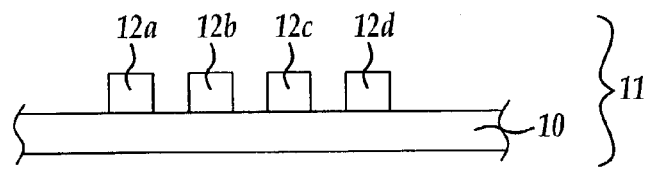

FIG. 1 and FIG. 2 show a schematic plan-view diagram and a schematic cross-sectional diagram of the non-defective photomask.

Within both FIG. 1 and FIG. 2, the non-defective photomask 11 comprises a transparent substrate 10 having formed thereupon a series of opaque pattern layers 12a, 12b, 12c and 12d.

Within the invention, the transparent substrate 10 is typically a quartz substrate formed to a thickness of from about 1 millimeter to about 10 millimeters. In addition, the opaque pattern layers 12a, 12b, 12c and 12d are typically opaque metal pattern layers, such as chromium opaque metal pattern layers. Other opaque metals, such as but not limited to aluminum, molybdenum, titanium and tungsten, may also be employed for forming the opaque pattern layers 12a, 12b, 12c and 12d. Within the invention, each of the series of opaque pattern layers 12a, 12b, 12c and 12d is typically formed to a thickness of from about 200 to about 1000 angstroms and a linewidth and spacing of from about 0.1 to about 1.0 microns.

Figure 3:
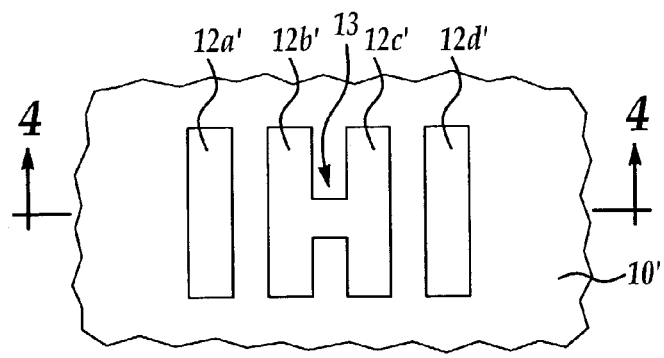
FIG. 3, FIG. 4, FIG. 5 and FIG. 6 show a series of schematic cross-sectional diagrams and schematic plan-view diagrams illustrating a pair of defective photomasks which may be repaired in accord with the invention.
Figure 4:
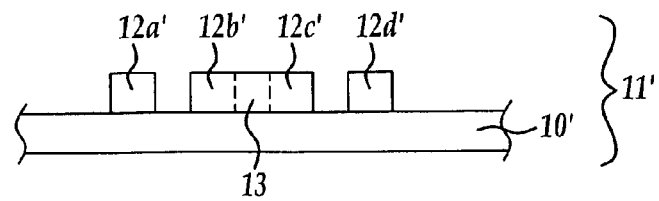

FIG. 3 and FIG. 4 show a schematic plan-view diagram and a schematic cross-sectional diagram of a first defective photomask which may be repaired in accord with the present invention.

Within both FIG. 3 and FIG. 4, the first defective photomask 11' comprises a transparent substrate 10' and a series of opaque pattern layers 12a', 12b', 12c' and 12d' as are otherwise identical in dimension and location with the transparent substrate 10 and the series of opaque pattern layers 12a, 12b, 12c and 12d within the non-defective photomask 11 as illustrated within FIG. 1 and FIG. 2. However, the first defective photomask 11' also comprises an opaque patterned layer excess defect 13 which is otherwise undesirable and bridges between the pair of opaque pattern layers 12b' and 12c'.

Figure 5:
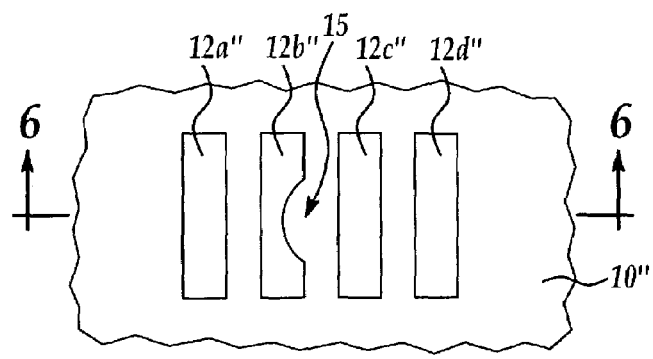
Figure 6:
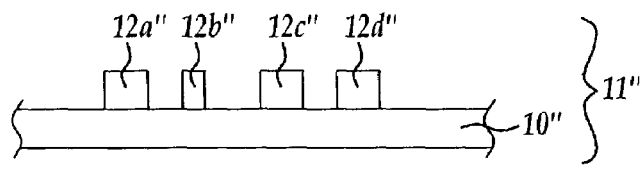

FIG. 5 and FIG. 6 show a schematic plan-view diagram and a schematic cross-sectional diagram of a second defective photomask which may be repaired in accord with the present invention.

Within both FIG. 5 and FIG. 6, the second defective photomask 11" comprises a transparent substrate 10" and a series of opaque pattern layers 12a", 12b", 12c" and 12d" as are otherwise identical in dimension and location with the transparent substrate 10 and the series of opaque pattern layers 12a, 12b, 12c and 12d within the non-defective photomask 11 as illustrated within FIG. 1 and FIG. 2. However, the second defective photomask 11" also comprises an opaque patterned layer deficiency defect 15 within the opaque pattern layer 12b". The opaque patterned layer deficiency defect 15 results in the opaque pattern layer 12b" having a portion thereof narrower in linewidth than desired.

The present invention is directed towards repairing defective photomasks, such as the defective photomasks 11' and 11" whose schematic plan-view diagrams and schematic cross-sectional diagrams are illustrated in FIG. 3, FIG. 4, FIG. 5 and FIG. 6, defects such as both the opaque pattern layer excess defect 13 as illustrated in FIG. 3 and the opaque pattern layer deficiency defect 15 as illustrated in FIG. 5.

FIG. 7 to FIG. 10 show a series of schematic cross-sectional diagrams illustrating the results of progressive stages in repairing the first defective photomask 11' as illustrated in FIG. 3 and FIG. 4, in accord with the present invention.

Figure 7:
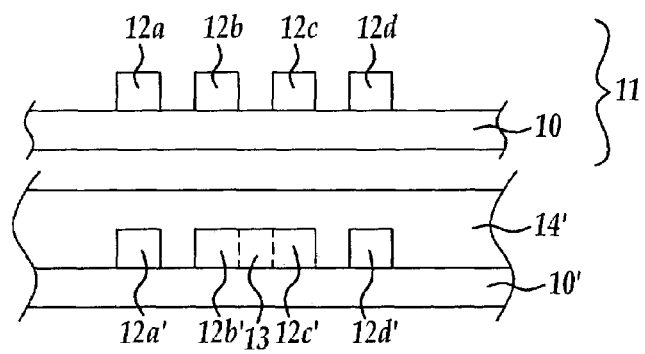
FIG. 7, FIG. 8, FIG. 9 and FIG. 10 show a series of schematic cross-sectional diagrams illustrating the results of progressive stages in repairing a first defective photomask in accord with the present invention.

FIG. 7 shows the first defective photomask of FIG. 4, in turn having formed thereupon a photoresist layer 14'. Within the invention, the photoresist layer 14' is formed of a positive photoresist material, as may be otherwise generally conventional in the microelectronic product fabrication art. Typically, the photoresist layer 14' is formed to a thickness of from about 8000 to about 20000 angstroms.

Also shown in FIG. 7 is the non-defective photomask 11 which is aligned with the defective photomask such that the non-defective pattern within the non-defective photomask is aligned with the defective pattern within the defective photomask. Such alignment may be undertaken within an otherwise conventional photomask alignment tool, or within a special apparatus which is specifically designed to achieve such alignment in accord with the present invention. Such a special apparatus is disclosed in greater detail below.

Figure 8:
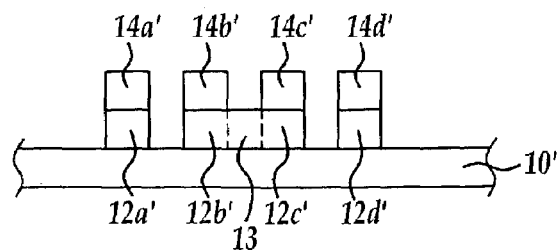

FIG. 8 shows the results of further processing of the defective photomask of FIG. 7.

FIG. 8 illustrates the results of photoexposing and developing the photoresist layer 14' of FIG. 7 to form a series of patterned photoresist layers 14a', 14b', 14c' and 14d' which are aligned upon the series of opaque pattern layers 12a', 12b', 12c' and 12d', and which leave exposed portions of the transparent substrate 10' and the opaque pattern layer excess defect 13. Photoexposure of the blanket photoresist layer 14' may be undertaken employing a photoexposure apparatus as is otherwise generally conventional in the microelectronic fabrication art, while employing photoexposure conditions as are appropriate for the positive photoresist material from which is formed the photoresist layer 14'. Development of the photoexposed photoresist layer 14' may be undertaken employing developing methods as are otherwise generally conventional in the microelectronic fabrication art.

Figure 9:
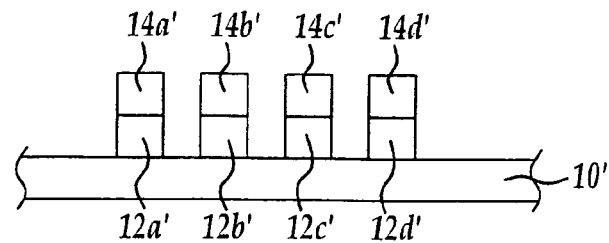

FIG. 9 shows the results of further processing of the defective photomask of FIG. 8.

FIG. 9 illustrates the results of etching the opaque pattern layer excess defect 13 interposed between the pair of opaque pattern layers 12b' and 12c', while employing the series of patterned photoresist layers 14a', 14b', 14c' and 14d' as an etch mask layer.

Within the invention, the opaque pattern layer excess defect 13 may be etched from between the opaque pattern layers 12b' and 12c' while employing etching methods including but not limited to wet chemical etching methods, dry plasma etching methods, sputter etching methods and aggregate methods thereof.

Figure 10:
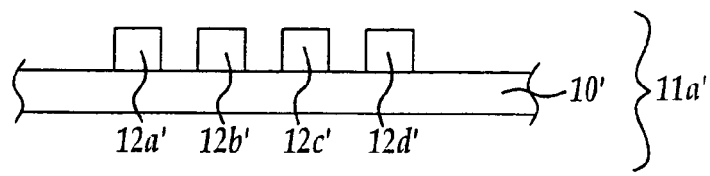

FIG. 10 shows the results of further processing of the defective photomask of FIG. 9.

FIG. 10 shows the results of stripping the series of patterned photoresist layers 14a', 14b', 14c' and 14d' from the corresponding series of opaque pattern layers 12a', 12b', 12c' and 12d', to thus form from the defective photomask 11' as illustrated in FIG. 4 a repaired defective photomask 11a'.

The series of patterned photoresist layers 14a', 14b', 14c' and 14d' may be stripped employing stripping methods and materials as are otherwise generally conventional in the microelectronic fabrication art.

FIG. 10 illustrates a repaired defective photomask 11a' identical with the non-defective photomask 11 as illustrated in FIG. 2. The repaired defective photomask 11a' is efficiently repaired while employing a photolithographic method which employs an identical non-defective pattern within the non-defective photomask as a photomask for forming upon a defective pattern within a defective photomask a patterned photoresist layer which serves as an etch mask layer for etching and repairing a defect within the defective pattern within the defective photomask.

Insofar as the invention employs an alignment and projection photolithographic method (rather than an ion beam method which charges a substrate) for forming a patterned photoresist layer as a defect repair mask layer, the present invention also provides for greater accuracy in image alignment when repairing the defect within the defective pattern within the defective photomask.

FIG. 11 to FIG. 14 show a series of schematic cross-sectional diagrams illustrating the results of progressive stages in repairing the second defective photomask 11" of FIG. 5 and FIG. 6, in accord with the present invention.

Figure 11:
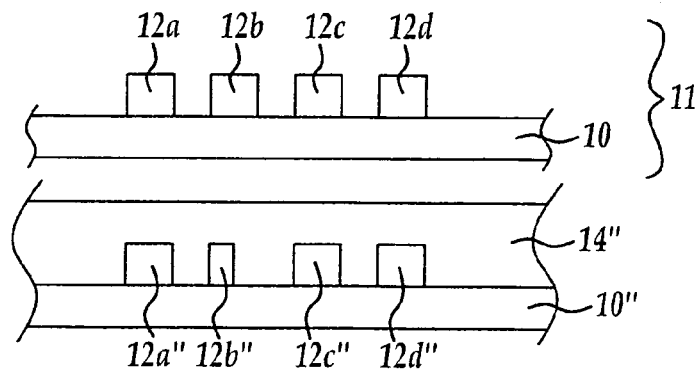
FIG. 11, FIG. 12, FIG. 13 and FIG. 14 show a series of schematic cross-sectional diagrams illustrating the results of progressive stages in repairing a second defective photomask in accord with the present invention.

FIG. 11 shows the second defective photomask 11" of FIG. 6, in turn having formed thereupon a photoresist layer 14". Within the invention, the photoresist layer 14" is formed of a negative photoresist material, as may be otherwise generally conventional in the microelectronic product fabrication art. Typically, the photoresist layer 14" is formed to a thickness of from about 8000 to about 20000 angstroms.

Also shown in FIG. 11 is the non-defective photomask 11 which is aligned with the defective photomask such that the non-defective pattern within the non-defective photomask 11 is aligned with the defective pattern within the defective photomask 11". Such alignment may be undertaken within an otherwise conventional photomask alignment tool, or within a special apparatus which is specifically designed to achieve such alignment in accord with the present invention. Such a special apparatus is disclosed in greater detail below.

Figure 12:
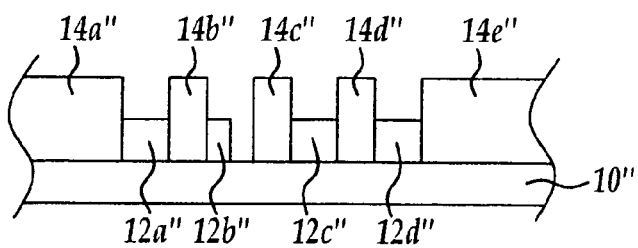

FIG. 12 shows the results of further processing of the defective photomask 11" of FIG. 11.

FIG. 12 illustrates the results of photoexposing and developing the photoresist layer 14" of FIG. 11 to form a series of patterned photoresist layers 14a", 14b", 14c", 14d" and 14e", which are interposed between the series of opaque pattern layers 12a", 12b", 12c" and 12d". FIG. 12 also illustrates a gap formed between the opaque pattern layer 12b" and the patterned photoresist layer 14c" at the location of the opaque patterned layer deficiency defect 15 as illustrated in FIG. 5. Photoexposure of the photoresist layer 14" may be undertaken employing a photoexposure apparatus as is otherwise generally conventional in the microelectronic fabrication art, while employing photoexposure conditions as are appropriate for the negative photoresist material from which is formed the photoresist layer 14". Development of the photoexposed photoresist layer 14" may be undertaken employing developing methods as are otherwise generally conventional in the microelectronic fabrication art.

Figure 13:
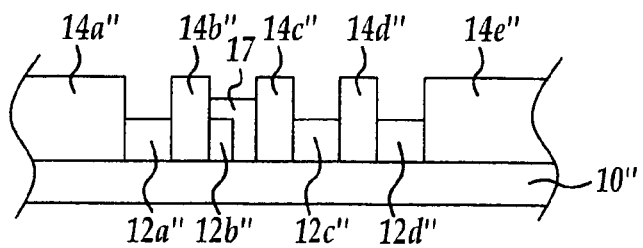

FIG. 13 shows the results of further processing of the defective photomask of FIG. 12.

FIG. 13 illustrates the results of depositing a patch layer 17 into the gap interposed between the opaque pattern layer 12b" and the patterned photoresist layer 14c", such as to fill the opaque patterned layer deficiency defect 15 as illustrated in FIG. 5. The patch layer 17 is typically also formed of an opaque material, and generally formed by employing a localized photoassisted deposition of a patch material.

Under such circumstances, the series of patterned photoresist layers 14a", 14b", 14c", 14d" and 14e" provide a barrier precluding deposition of excess patch material upon the transparent substrate.

Figure 14:
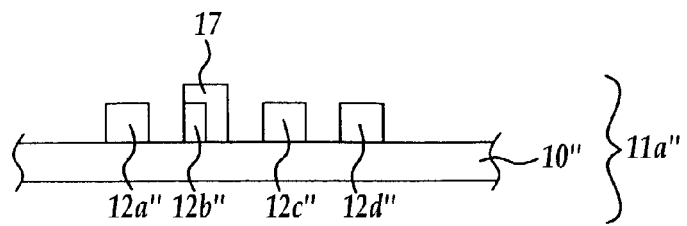

FIG. 14 shows the results of further processing of the defective photomask of FIG. 13.

FIG. 14 shows the results of stripping the series of patterned photoresist layers 14a", 14b", 14c", 14d" and 14e" from the defective photomask as illustrated in FIG. 13, to thus form a repaired defective photomask 11a".

The series of patterned photoresist layers 14a", 14b", 14c", 14d" and 14e" may be stripped employing stripping methods and materials as are otherwise generally conventional in the microelectronic fabrication art.

FIG. 14 illustrates a repaired defective photomask 11a" functionally equivalent with the non-defective photomask 11 as illustrated in FIG. 2. The repaired defective photomask is efficiently repaired while employing a photolithographic method which employs an identical non-defective pattern within the non-defective photomask as a photomask for forming upon a defective pattern within a defective photomask a patterned photoresist layer which serves as a mask layer for repairing the defect within the defective pattern within the defective photomask.

Figure 15:
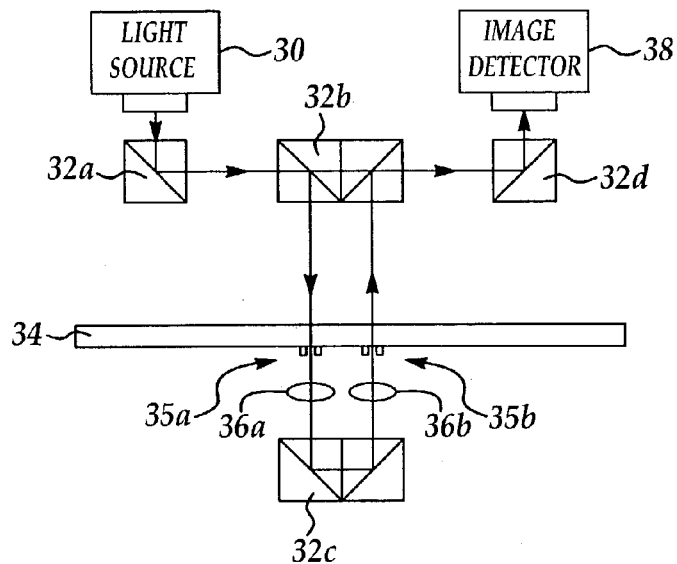
FIG. 15 and FIG. 16 show a pair of schematic diagrams illustrating operation of a photolithographic apparatus for repairing a photomask in accord with the present invention.
Figure 16:
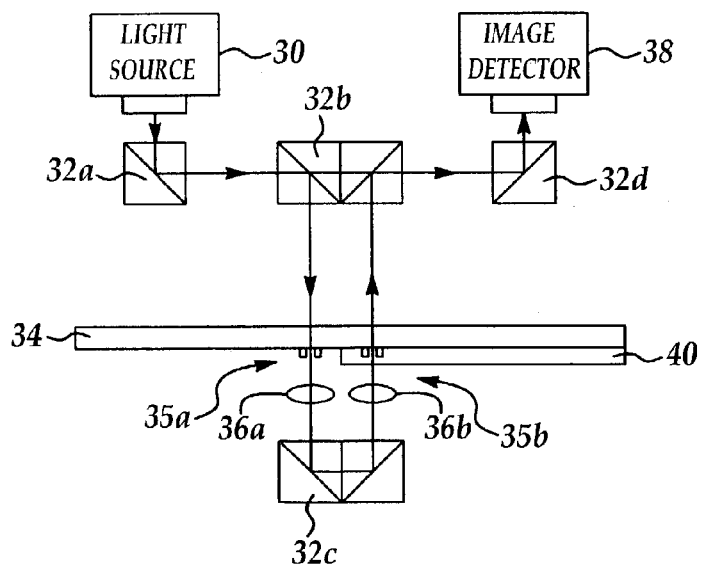

FIG. 15 and FIG. 16 show a pair of schematic diagrams illustrating an apparatus which may be employed for repairing a defective photomask in accord with the invention.

The apparatus comprises an alignment and photoexposure light source 30, a light beam from which travels through a series of mirrors 32a, 32b, 32c and 32d and a pair of lenses 36a and 36b to reach an image detector 38.

Within the apparatus, a defective photomask 34 having both a non-defective pattern region 35a and a corresponding otherwise dimensionally identical defective pattern region 35b having formed therein a minimum of one defect, is positioned within the apparatus such that the non-defective pattern within the non-defective pattern region 35a may be optically projected and aligned upon the defective pattern within the defective pattern region 35b.

FIG. 15 illustrates the general alignment characteristics of the apparatus. Such preliminary optical projection alignment is also intended as applicable when employing a non-defective photomask separate from a defective photomask, in accord with the above disclosure. FIG. 16 further illustrates a photoresist layer 40 formed upon the defective pattern within the defective pattern region 35b, but not upon the non-defective pattern within the non-defective pattern region 35a. When a photoexposure radiation dose (rather than an optical projection alignment radiation dose) is issued from the light source 30, a portion of the photoresist layer 40 covering the defective pattern region 35b may be photoexposed in accord with the invention.

Thus, as illustrated within FIG. 15 and FIG. 16, a defect within a defective pattern region within a defective photomask may be repaired while employing as a photomask a non-defective pattern region within the same defective photomask.

While the foregoing disclosure describes the invention within the context of repairing a defective photomask having either an opaque pattern layer excess defect or an opaque pattern layer deficiency defect, the present invention is not intended to be specifically so limited. Rather, the present invention may also be employed for repairing within defective microelectronic products defective patterned layers formed of materials including but not limited to conductor materials, semiconductor materials and dielectric materials formed upon substrates formed of materials including but not limited to conductor materials, semiconductor materials, dielectric materials and laminates thereof. In accord with the foregoing materials limitations, examples of defective microelectronic products which may be repaired in accord with the invention, as well as corresponding repaired defective microelectronic products after such repair, are illustrated in FIG. 17 to FIG. 20.

Figure 17:
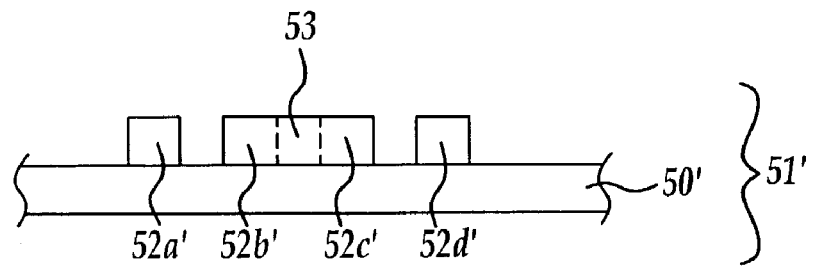
FIG. 17, FIG. 18, FIG. 19 and FIG. 20 show a series of schematic cross-sectional diagrams illustrating a pair of defective microelectronic products which may be repaired in accord with the invention, as well as a pair of repaired defective microelectronic products repaired in accord with the invention.

FIG. 17 illustrates a defective microelectronic product 51' comprising a substrate 50' having formed thereupon a series of patterned layers 52a', 52b', 52c' and 52d' of which the patterned layers 52b' and 52c' are bridged by a patterned layer excess defect 53. The defective microelectronic product 51' of FIG. 17 corresponds generally with the defective photomask 11' of FIG. 3 and FIG. 4.

Figure 18:
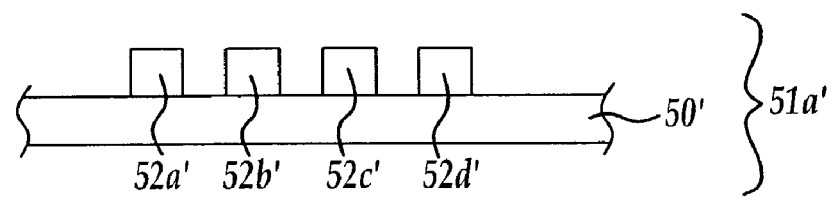

FIG. 18 illustrates a repaired defective microelectronic product 51a' corresponding with the defective microelectronic product 51' of FIG. 17, but where the patterned layer excess defect 53 has been removed. The patterned layer excess defect 53 may be removed employing a processing sequence analogous, equivalent or identical to the processing sequence as illustrated in FIG. 7 to FIG. 10 for repairing the defective photomask 11' as illustrated in FIG. 3 and FIG. 4, but where the defective photomask 11' is replaced with the defective microelectronic product 51'.

Figure 19:
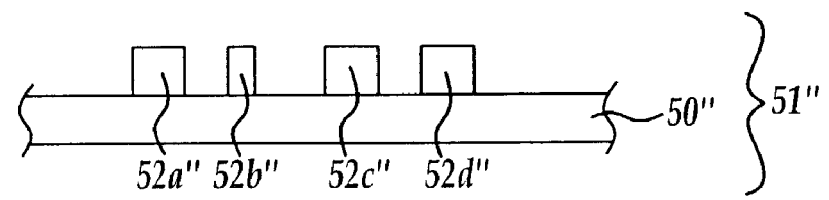

FIG. 19 illustrates a defective microelectronic product 51" comprising a substrate 50" having formed thereupon a series of patterned layers 52a", 52b", 52c" and 52d", where the patterned layer 52b" is undersized such as to represent a patterned layer deficiency defect. The defective microelectronic product 51" of FIG. 19 corresponds generally with the defective photomask 11" of FIG. 5 and FIG. 6.

Figure 20:
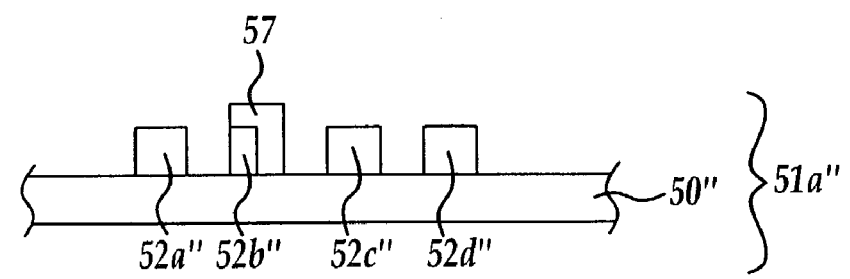

FIG. 20 illustrates a repaired defective microelectronic product 51a" corresponding with the defective microelectronic product 51" of FIG. 19, but where the undersized patterned layer 52b" has been supplemented with a patch layer 57. The patch layer 57 may be formed employing a processing sequence analogous, equivalent or identical to the processing sequence as illustrated in FIG. 11 to FIG. 14 for repairing the defective photomask 11" as illustrated in FIG. 5 and FIG. 6, but where the defective photomask 11" is replaced with the defective microelectronic product 51".

Within the additional embodiments of the invention as illustrated in FIG. 17 to FIG. 20, and when the substrate 50' or 50" is not formed of a transparent material, the apparatus as illustrated in FIG. 15 and FIG. 16 may not be employed and an independent non-defective photomask is required for optical alignment and optical projection purposes.

The preferred embodiments of the invention are illustrative of the invention rather than limiting of the invention. Revisions and modifications may be made to materials, structures and dimensions in accord with the preferred embodiments of the invention while still providing a method for repairing a defective photomask or a defective microelectronic product in accord with the present invention, further in accord with the accompanying claims.

What is claimed is:

1. A method for repairing a defective photomask having one or more defects comprising:
   providing a defective photomask having contained therein a defective pattern having a minimum of one defect;
   providing a non-defective photomask having contained therein a non-defective pattern identical to the defective pattern, but absent the minimum of one defect;
   aligning via optical projection the non-defective pattern within the non-defective photomask with the defective pattern within the defective photomask;
   forming a photoresist layer upon the defective photomask including the defective pattern to form a photoresist coated defective photomask;
   photoexposing in a single pattern transfer process the photoresist coated defective photomask through the non-defective pattern within the non-defective photomask;
   developing the photoresist layer upon the photoresist coated defective photomask to form a patterned photoresist layer coated defective photomask which leaves exposed the minimum of one defect within the defective pattern; and
   repairing the minimum of one defect within the defective pattern while employing the patterned photoresist layer as a repair mask.

2. The method of claim 1 wherein the defective photomask comprises a pattern for fabricating a semiconductor product.

3. The method of claim 1 wherein the minimum of one defect is an opaque pattern layer excess defect.

4. The method of claim 3 wherein the photoresist layer is formed of a positive photoresist material.

5. The method of claim 4 wherein the opaque pattern layer excess defect is repaired by etching while employing a method selected from the group consisting of wet chemical etch methods and dry etch methods.

6. The method of claim 1 wherein the minimum of one defect is an opaque pattern layer deficiency defect.

7. The method of claim 6 wherein the photoresist layer is formed of a negative photoresist material.

8. The method of claim 7 wherein the opaque pattern layer deficiency defect is repaired employing a deposition method.

9. A method for repairing a defective photomask having one or more defects comprising:
   providing a single defective photomask having contained therein
   a defective pattern region having a minimum of one defect; and
   a non-defective pattern region identical to the defective pattern region, but absent the minimum of one defect;
   forming a photoresist layer upon the defective pattern region to form a photoresist coated defective pattern region;
   then aligning via optical projection the non-defective pattern region with the photoresist coated defective pattern region;
   then photoexposing the photoresist coated defective photomask through the non-defective pattern within the non-defective photomask;
   then developing the photoresist layer upon the photoresist coated defective photomask to form a patterned photoresist layer coated defective photomask which leaves exposed the minimum of one defect within the defective pattern; and
   then repairing the minimum of one defect within the defective pattern while employing the patterned photoresist layer as a repair mask.

10. The method of claim 9 wherein the defective photomask comprises a pattern for fabricating a semiconductor product.

11. The method of claim 9 wherein the minimum of one defect is an opaque pattern layer excess defect.

12. The method of claim 11 wherein the photoresist layer is formed of a positive photoresist material.

13. The method of claim 12 wherein the opaque pattern layer excess defect is repaired by etching while employing a method selected from the group consisting of wet chemical etch methods and dry etch methods.

14. The method of claim 9 wherein the minimum of one defect is an opaque pattern layer deficiency defect.

15. The method of claim 14 wherein the photoresist layer is formed of a negative photoresist material.

16. The method of claim 15 wherein the opaque pattern layer deficiency defect is repaired employing a deposition method.

17. A method for repairing a defective microelectronic product having one or more defects comprising:
   providing a defective microelectronic product comprising a substrate having formed thereover a defective pattern having a minimum of one defect;
   providing a non-defective photomask having contained therein a non-defective pattern identical to the defective pattern, but absent the minimum of one defect;
   aligning via optical projection the non-defective pattern within the non-defective photomask with the defective pattern within the defective microelectronic product;
   forming a photoresist layer upon the defective microelectronic product including the defective pattern to form a photoresist coated defective microelectronic product;
   photoexposing in a single pattern transfer process the photoresist coated defective microelectronic product through the non-defective pattern within the non-defective photomask;
   developing the photoresist layer upon the photoresist coated defective microelectronic product to form a patterned photoresist layer coated defective microelectronic product which leaves exposed the minimum of one defect within the defective pattern; and
   repairing the minimum of one defect within the defective pattern while employing the patterned photoresist layer as a repair mask.

18. The method of claim 17 wherein the defect is selected from the group consisting of a patterned layer excess defect and a patterned layer deficiency defect.

19. The method of claim 17 wherein the minimum of one defect is a patterned layer excess defect and the photoresist layer is formed of a positive photoresist material.

20. The method of claim 17 wherein the minimum of one defect is a patterned layer deficiency defect and the photoresist layer is formed of a negative photoresist material.

* * * * *